United States Patent
Duvillard et al.

(10) Patent No.: US 7,304,512 B2
(45) Date of Patent: Dec. 4, 2007

(54) FREQUENCY DIVIDER AND AN ELECTRONIC DEVICE INCORPORATING SUCH A FREQUENCY DIVIDER

(75) Inventors: Sylvain Duvillard, Cannes (FR); Patrick Da Silva, Antibes (FR)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 10/575,958

(22) PCT Filed: Sep. 24, 2004

(86) PCT No.: PCT/IB2004/003123

§ 371 (c)(1),
(2), (4) Date: Apr. 12, 2006

(87) PCT Pub. No.: WO2005/036751

PCT Pub. Date: Apr. 21, 2005

(65) Prior Publication Data

US 2007/0079164 A1    Apr. 5, 2007

(30) Foreign Application Priority Data

Oct. 13, 2003  (EP) .................................. 03292539

(51) Int. Cl.
*H03B 19/00*        (2006.01)
(52) U.S. Cl. ...................... 327/113; 327/115; 327/117; 377/47

(58) Field of Classification Search .................... None
See application file for complete search history.

(56) References Cited

U.S. PATENT DOCUMENTS

| 6,009,139 A | 12/1999 | Austin et al. |
| 6,040,725 A * | 3/2000 | Lee et al. .................... 327/175 |
| 6,393,089 B1 * | 5/2002 | Maba et al. .................... 377/47 |
| 6,469,549 B2 * | 10/2002 | Carson et al. .............. 327/115 |
| 2003/0007591 A1 | 1/2003 | Holzle |

FOREIGN PATENT DOCUMENTS

| EP | 1 244 214 | 9/2002 |
| WO | WO 03/073244 | 9/2003 |

* cited by examiner

*Primary Examiner*—Tuan T. Lam
*Assistant Examiner*—An T. Luu

(57) ABSTRACT

The frequency divider for high-frequency clock signal comprises: a shift register (8) having cells (10-13) for storing each bit of an initial word, said cells being series connected in a loop (14), and said shift register being capable of shifting each bit of the initial word from the cell in which it is stored to the next cell in the loop at a rate clocked by the high-frequency clock signal, and wherein an output terminal (6) for outputting a frequency-divided clock signal is connected to the output of one cell of the loop of series-connected cells.

8 Claims, 2 Drawing Sheets

FREQUENCY DIVIDER AND AN ELECTRONIC DEVICE INCORPORATING SUCH A FREQUENCY DIVIDER

FIELD OF THE INVENTION

The present invention relates to a digital frequency divider circuit comprising an input terminal for receiving a clock signal, whose frequency of which is to be divided and an output terminal for outputting a frequency divided clock signal.

BACKGROUND OF THE INVENTION

Frequency dividers are among the basic circuits of digital technology. Frequency dividers are digital circuits, and the input frequencies are integer multiples of the output frequencies. Such circuits are used for example in radiofrequency technology, where there exists continual demand for the development of circuits with ever higher clock rates or frequencies. In order to realize frequency dividers, usually a plurality of gates are connected in series in a combinatorial part of the divider, so that, for each state change of the input signal, many gates are switched within one clock period.

The maximum possible input frequency of a frequency divider is thus limited by the sum of the signal propagation times of the series-connected gates.

US 2003/0007591 discloses a frequency divider that overcomes the above mentioned disadvantage. This frequency divider comprises among other components a state register, a decoder, a loading device and a parallel to serial converter. Some of these components are clocked with a high frequency clock, whereas other components are clocked with a low frequency clock. Due to the use of many components and of two frequency clocks, the frequency divider disclosed in US 2003/0007591 remains quite complicated to manufacture.

SUMMARY OF THE INVENTION

It is accordingly an object of the invention to provide a frequency divider that is able to operate at high frequency and remains quite easy to manufacture.

With the foregoing and other objects in view there is provided, in accordance with the invention, a frequency divider comprising a shift register having cells for storing each bit of an initial word, said cells being series connected in a loop, and said shift register being capable of shifting each bit of the initial word from the cell in which it is stored to the next cell in the loop at a rate clocked by the received clock signal, and wherein the output terminal is connected to the output of one cell of the loop of series-connected cells.

In the above frequency divider, the cells of the shift register are connected to each other in order to form a loop, so that bits shifted turn around or rotate. In such a shift register, if the same initial word is repeatedly shifted in synchronism with the received clock signal, the signal observed at one output of one of the cells is periodic and its frequency is a submultiple of the frequency of the received clock signal. It can be noticed that such frequency divider does not comprise any series connected gates. Consequently, high clock rates can be processed. Furthermore, the number of components of this frequency divider is reduced compare to the frequency divider of US 2003/007591. So, this frequency divider is simpler to manufacture.

The features as defined in claims 2 to 4 have the advantage that the divider ratio of the frequency divider is adjustable.

The features as defined in claims 5 to 7 have the advantage that the duty cycle of the frequency divider can be selected.

Other features of the claimed invention are recited in the dependent claims.

The invention also concerns an electronic device including a frequency divider according to claim 1.

These and other aspects of the invention will be apparent from and elucidated with reference to the embodiments describes hereinafter.

DESCRIPTION OF PREFERRED EMBODIMENTS

Figure 1:
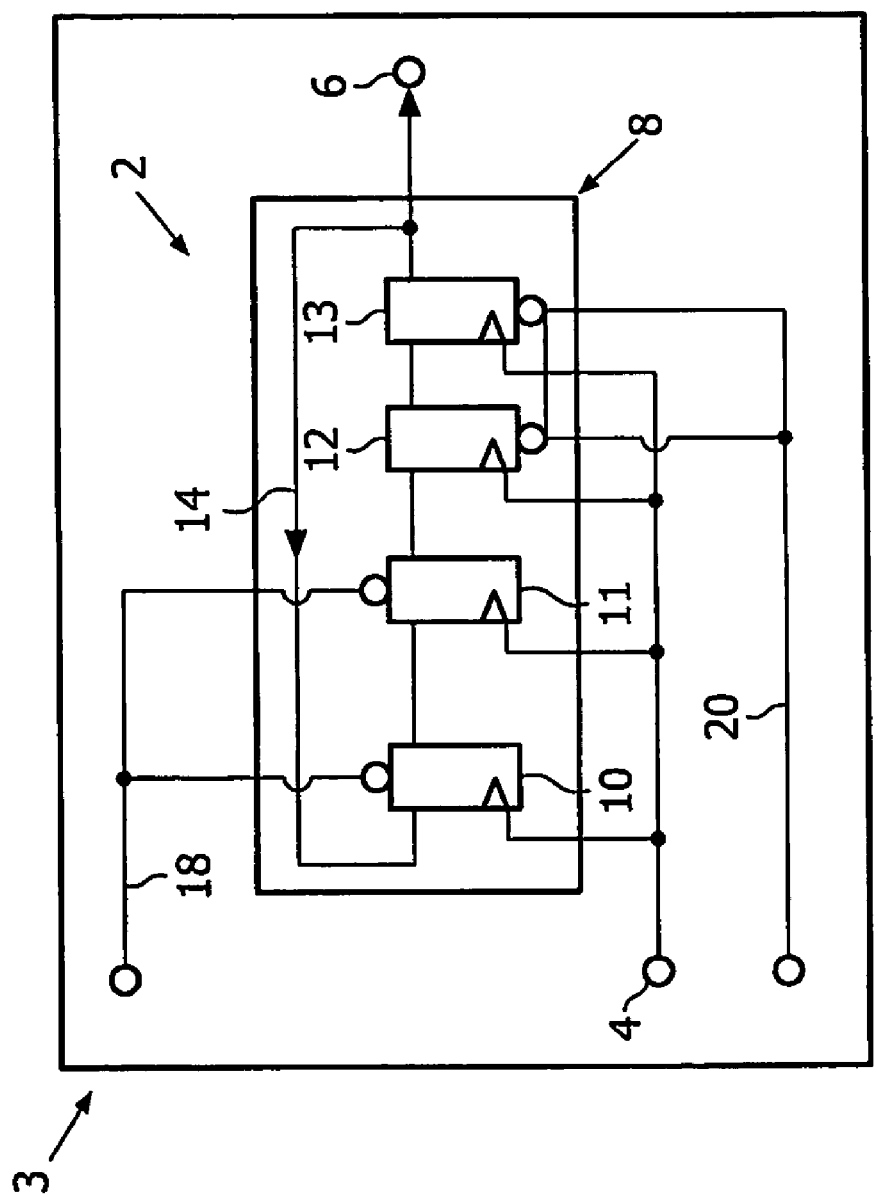
FIG. 1 is a schematic diagram of a first embodiment of a frequency divider according to the invention.

FIG. 1 represents a first embodiment of a frequency divider 2. The frequency divider 2 will be described only for illustrative proposes in the special case where the divider ratio of the frequency divider is equal to four and its duty cycle is equal to 50/50.

The value x/y for the duty cycle indicates that during x per cents of the time, the output clock signal should be set to a logic one, whereas during the remaining time the output clock signal should be set to a logic zero.

Frequency divider 2 is used in an electronic device 3 in FIG. 1 that needs clock frequency division operations to be carried out.

Frequency divider 2 comprises an input terminal 4 and an output terminal 6. Terminal 4 is for receiving the clock signal whose frequency is to be divided by the divider ratio. Terminal 6 is for outputting a clock signal whose frequency is equal to the frequency of the received clock signal divided by the divider ratio.

The frequency divider 2 comprises a shift register 8 having four cells 10 to 13 clocked in synchronism by the same input clock that is the clock received at terminal 4. In order to do so, the clock input of each cell is directly connected to terminal 4.

Here, each cell is a flip-flop or a scannable circuit.

The output of each flip-flop is directly connected to the input of a following flip-flop except for last flip-flop 13. The output of flip-flop 13 is connected to the input of first flip-flop 10. Such a design forms a loop 14 in which flip-flops 10 to 13 are connected in series.

The first two flip-flops 10 and 11 are connected to a common reset line 18 in order to initialize these two first flip-flops with a logic one at the output. The other two flip-flops 12 and 13 are connected to a reset line 20 in order to initialize these two flip-flops with a logic zero at the output.

Reset lines 18, 20 are connected, for example, to respective and different fixed potentials so that flip-flops 10 and 11 are always initialized with a logic one, whereas flip-flops 12 and 13 are always initialized with a logic zero.

The way in which frequency divider 2 works will now be explained.

At initialization, reset lines 18 and 20 write 8 an initial word "1100" in shift register.

When a rising edge occurs in the received clock signal at terminal 4, value from the output of each flip-flop is captured on the following flip-flop. Consequently, each bit of the word "1100" is shifted by one position on the left at each rising edge of the received clock signal. This is illustrated in the following table.

TABLE 1

| Received clock signal | Flip-flop 10 | Flip-flop 11 | Flip-flop 12 | Flip-flop 13 | Output clock signal |
|---|---|---|---|---|---|
| Initial state | 1 | 1 | 0 | 0 | 0 |
| 1st rising edge | 0 | 1 | 1 | 0 | 0 |
| 2nd rising edge | 0 | 0 | 1 | 1 | 1 |
| 3rd rising edge | 1 | 0 | 0 | 1 | 1 |
| 4th rising edge | 1 | 1 | 0 | 0 | 0 |
| 5th rising edge | 0 | 1 | 1 | 0 | 0 |

The first line of Table 1 shows the output values of each flip-flop 10 to 13 in the initial state of shift register 8. The following lines shows the output value of flip-flops 10 to 13 respectively after the first, second, third, fourth, fifth rising edge of the received clock signal. The last column of Table 1 shows the output value at terminal 6 corresponding to each rising edge.

As shown, the initial word "1100" is shifted by one position at each rising edge of the received clock signal and the bit output by flip-flop 13 is returned to the input of flip-flop 10. The value stored in the shift register is periodically repeated every four rising edges of the received clock signal. Therefore, the output clock signal presents only one rising edge every four rising edges of the received clock signal. So the frequency of the output clock signal is four time lower than the frequency of the received clock signal.

Furthermore it can be noted that the duty cycle of the frequency divider 2 is equal to 50/50 since during one period of the output clock signal, the value of the output clock signal is equal to "1" during 50% of the time and equal to "0" during the remaining time.

The maximum possible frequency of the received clock signal is only limited in frequency divider 2 by the signal propagation time through one flip-flop. For example, if the signal propagation time of a signal from the input of one flip-flop to the output of the same flip-flop is equal to 1 ns, the maximum possible input frequency is up to 1 GHz.

Furthermore, the duty cycle of frequency divider 2 can be easily changed by initializing the shift register with a different initial word, like "1000" or "1110". The initial word should be comprised between 1 and $2^n-2$, where n is the number of cells of the shifted register.

However, in the preferred embodiment, the setting of each flip-flop is not adjustable or programmable in order to ease the test of the frequency divider during the manufacturing process using a test method known as "SCAN test". For example, the initial setting of each flip-flop is hardwired.

Figure 2:
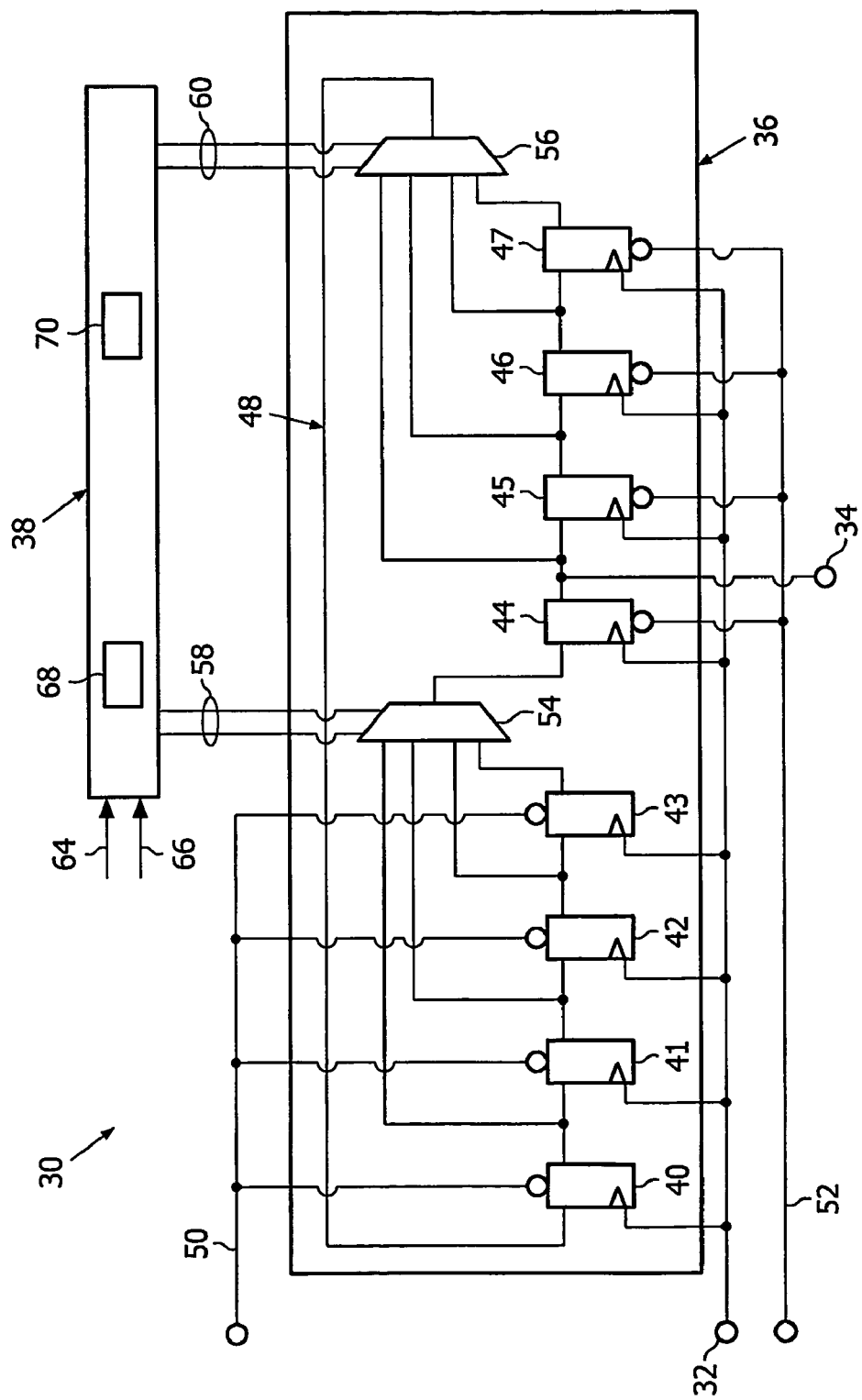
FIG. 2 is a schematic diagram of a second embodiment of a frequency divider according to the invention.

FIG. 2 illustrates a second embodiment of a frequency divider designated by the general reference 30. The frequency divider 30 is designed to have an adjustable duty as well as a programmable divider ratio.

Similarly to frequency divider 2, frequency divider 30 comprises an input terminal 32 to receive the input clock signal whose frequency is to be divided, and an output terminal 34 for outputting the divided frequency clock signal.

Frequency divider 30 also comprises a shift register 36 clocked by the input clock signal and a control unit 38 for configuring the shift register 36.

As an example, shift register 36 is designed to have a maximum divider ratio equal to eight. Therefore, shift register 36 comprises eight flip-flops 40 to 47 connected in series in a loop 48. Flip-flops 40 to 43 form a first group of series-connected flip-flops whose outputs are always initialized at a logic one, and flip-flops 44 to 47 form a second group of series-connected flip-flops whose outputs are always initialized at a logic zero.

In order to initialize the output of the flip-flops of the first group at a logic one, one reset input of each flip-flop is connected to a reset line 50 which is configured to always set up a logic one at initialization of shift register 36.

Similarly, the reset input of each flip-flop of the second group is connected to a reset line 52 which is configured to always set up a logic zero in flip-flops 44 to 47 at initialization of shift register 36.

Loop 48 of shift register 36 also has only two multiplexers 54 and 56. Multiplexer 54 is connected between the first and second groups of flip-flops, whereas multiplexer 56 is connected between the second and first groups of flip-flops. More precisely, the output of each flip-flop of the first group is connected to a corresponding input of multiplexer 54 and an output of multiplexer 54 is connected to the first flip-flop of the second group, that is flip-flop 44.

The output of each flip-flop of the second group is connected to a corresponding input of multiplexer 56. An output of multiplexer 56 is connected to the first flip-flop of the first group, that is flip-flop 40.

Two control lines 58 and 60 are connected between control unit 38 and multiplexers 54 and 56, respectively, in order to select which input of a multiplexer should be connected to its output.

Control unit 38 has two inputs 64 and 66. Input 64 is provided for receiving the value of the desired duty cycle and input 66 for receiving the value of the desired divider ratio.

Control unit 38 is designed to configure the shift register 36, so that the duty cycle and the divider ratio of the frequency divider are equal respectively, to the input desired duty cycle and divider ratio. In order to do so, the control unit 38 has a module 68 to determine the number of flip-flops that should be used in loop 48 to obtain the desired divider ratio and a module 70 to determine which flip-flops of shift register 36 should be used in loop 48 to obtain the desired duty cycle.

Modules 68 and 70 are realized in a conventional way in order to implement the functionality described below.

The way in which frequency divider 30 works, will now be explained in the particular situation where the desired duty cycle is equal to 25/75 and the desired divider ratio is equal to four.

At initialization, module 68 determines that to obtain a divider ratio equal to four, four flip-flops should be used in the loop of shift register 36, since the number of flip-flops needed is equal to the desired divider ratio.

Module 70 determines that 25 per cent of the flip-flops to be used should be selected in the first group, whereas the other flip-flops to be used should be selected in the second group. Indeed, the first value of the desired duty cycle, here "25", fixes the percentage of the flip-flops to be used that should be selected in the first group. In the particular situation described here as an example, this means that one flip-flop should be selected in the first group and three flip-flops should be selected in the second group.

So, during an initialization step, control unit 38 controls multiplexer 54 in order to connect the output of flip-flop 40 to the input of flip-flops 44. Control unit 38 also controls multiplexer 56 in order to connect the output of flip-flop 46 to the input of flip-flops 40.

After this initialization step, the loop of shift register 36 only comprises four flip-flops, which are flip-flops 40, 44, 45 and 46, and the initial word to be shifted by one position at each rising edge of the input clock signal is equal to "1000". This initial word corresponds exactly to a duty cycle equal to 25/75.

Now the frequency divider 30 is ready to work and works exactly as already explained for frequency divider 2. Therefore, no further explanation will be given.

In comparison to frequency divider 2, frequency divider 30 presents the advantages to have adjustable duty cycle ratio and divider ratio. However, the maximum possible input frequency for the input clock signal is slightly lower than the maximum possible input frequency of frequency divider 2. Indeed, the maximum possible input frequency of frequency divider 30 is determined by the signal propagation time of one flip-flop and one multiplexer.

Otherwise, frequency divider 30 presents exactly the same advantages as frequency divider 2. In particular, the initial state of each flip-flop of shift register 36 is always the same, so that frequency divider 30 can easily be tested during the manufacturing process using the SCAN test method.

Frequency dividers 2 and 30 have been described in the particular situation where the number of cells of frequency dividers 2 and 30 is equal to four and eight, respectively. In another embodiment, depending on the maximum divider ratio to be adjusted, the number of cells can be greater or smaller.

Frequency dividers 2 and 30 have been described in the particular situation where the cells of the shift register are flip-flops. However, other components selected from sequential logic components can be used to replace the flip-flops. However, care should be taken as to the signal propagation time of these other components that could be used to replace flip-flops.

The invention claimed is:

1. A frequency divider comprising: an input terminal for receiving a clock signal whose frequency is to be divided, an output terminal for outputting a frequency divided clock signal, wherein the frequency divider comprises: a shift register having cells for storing each bit of an initial word, said cells being series connected in a loop, and said shift register being capable of shifting each bit of the initial word from the cell in which it is stored to the next cell in the loop at a rate clocked by the received clock signal, wherein the output terminal is connected to the output of one cell of the loop of series-connected cells, and wherein the cells used in the loop of the shift register are selectable in either one of a first and a second group of cells, each cell of the first group always being initialized with a logic one, and each cell of the second group always being initialized with a logic zero.

2. The frequency divider according to claim 1, wherein the number of cells connected in series in the loop is adjustable, and wherein the frequency divider comprises a control unit to adjust this number of cells in order to achieve a desired frequency divider ratio.

3. The frequency divider according to claim 2, wherein said shift register comprises at least one multiplexer to adjust the number of cells in the loop.

4. The frequency divider according to claim 3, wherein each input of each multiplexer is connected to the output of a respective cell of a group of series-connected cells, and an output of each multiplexer is connected to a next cell in said loop, and wherein the control unit is able to control said at least one multiplexer in order to select which input of the or each multiplexer is connected to its output.

5. The frequency divider according to claim 1, wherein the frequency divider comprises a control unit to select the cells used in the loop of the shift register in either one of said first and second groups in order to achieve a desired duty cycle.

6. The frequency divider according to claim 5, wherein the shift register comprises a first and a second multiplexer to select cells in either the first or the second group.

7. The frequency divider according to claim 6, wherein the output of each cells of the first group is connected to respective inputs of the first multiplexer and an output of the first multiplexer is connected to the input of one cell of the second group, and the output of each cell of the second group is connected to respective inputs of the second multiplexer and an output of the second multiplexer is connected to the input of one cell of the first group, and wherein the control unit is able to control the first and second multiplexers in order to select for each of them which input of the multiplexer is connected to its output according to the desired duty cycle.

8. The frequency divider according to any one of the previous claims, wherein the cells are flip-flops.

* * * * *